(12) United States Patent
Tan et al.

(10) Patent No.: US 7,815,820 B2
(45) Date of Patent: Oct. 19, 2010

(54) ELECTROMAGNETIC INTERFERENCE SHIELDING POLYMER COMPOSITES AND METHODS OF MANUFACTURE

(75) Inventors: Daniel Qi Tan, Rexford, NY (US); Yang Cao, Niskayuna, NY (US); Patricia Chapman Irwin, Altamont, NY (US)

(73) Assignee: General Electric Company, Niskayuna, NY (US)

( * ) Notice: Subject to any disclaimer, the term of this patent is extended or adjusted under 35 U.S.C. 154(b) by 339 days.

(21) Appl. No.: 11/863,831

(22) Filed: Oct. 18, 2007

(65) Prior Publication Data

US 2009/0101873 A1    Apr. 23, 2009

(51) Int. Cl.
  *H01B 1/02*    (2006.01)
  *H01B 1/04*    (2006.01)
  *H01B 1/12*    (2006.01)
(52) U.S. Cl. .............. 252/518.1; 252/519.31; 252/519.33; 252/520.1; 252/520.2; 252/521.2; 252/62.55; 250/515.1
(58) Field of Classification Search .............. 252/518.1, 252/519.31, 519.33, 520.1, 520.2, 521.2
See application file for complete search history.

(56) References Cited

U.S. PATENT DOCUMENTS

| | | | |
|---|---|---|---|
| 4,783,279 A * | 11/1988 | Petermann et al. | ........... 252/511 |
| 4,973,514 A | 11/1990 | Gamble et al. | |
| 5,190,841 A * | 3/1993 | Saha et al. | ............. 430/111.31 |
| 5,488,766 A | 2/1996 | Gerry et al. | |
| 5,856,395 A * | 1/1999 | Tanisho et al. | ............... 524/413 |
| 5,938,979 A | 8/1999 | Kambe et al. | |
| 6,864,418 B2 * | 3/2005 | Wang et al. | ................. 174/391 |
| 2002/0035170 A1 | 3/2002 | Glatkowski et al. | |
| 2002/0198286 A1 * | 12/2002 | Igarashi et al. | ............... 523/137 |
| 2005/0175917 A1 * | 8/2005 | Lee et al. | .................. 430/106.2 |
| 2006/0099403 A1 * | 5/2006 | Johnson | ....................... 428/323 |
| 2006/0251203 A1 | 11/2006 | Okamura et al. | |
| 2007/0252771 A1 * | 11/2007 | Maezawa et al. | ............ 343/841 |

OTHER PUBLICATIONS

Z.W. Li et al.; Co2+Ti4+ substituted Z-type barium ferrite with enhanced imaginary permeability and resonance frequency; Journal of Applied Physics 99, 063905 (2006); 7 Pages; Downloaded Jun. 2, 2006 to 192.35.44.24. Redistribution subject to AIP license or copyright, see http://jap.aip.org/jap/copyright.jsp.

(Continued)

*Primary Examiner*—Mark Kopec
*Assistant Examiner*—Jaison P Thomas
(74) *Attorney, Agent, or Firm*—Paul J. DiConza

(57) ABSTRACT

An electromagnetic interference shielding composite is provided. The electromagnetic interference shielding composite comprises: a high permittivity polymer having a permittivity of at least about 5; a plurality of magnetic particles dispersed within the high permittivity polymer; and a plurality of dielectric particles dispersed within the high permittivity polymer. In another embodiment, an article comprising a device susceptible to electromagnetic radiation and a shielding material disposed to shield the device from electromagnetic radiation is provided. The shielding material comprises, a high permittivity polymer; a plurality of magnetic particles dispersed within the high permittivity polymer; and plurality of dielectric particles dispersed within the high permittivity polymer.

32 Claims, 5 Drawing Sheets

OTHER PUBLICATIONS

Tang et al.; A Low-Profile Power Converter Using Printed-Circuit Board (PCB) Power Transformer with Ferrite Polymer Composite; IEEE Transactions on Power Electronics, vol. 16, No. 4, Jul. 2001; Retrieved from- http://ieeexplore.ieee.org/iel5/63/20140/00931055.pdf; 6 Pages.

Joseph V. Mantese et al.; Applicability of effective medium theory to ferroelectric/ferrimagnetic composites with composition and frequency-dependent complex permittivities and permeabilities; J. Appl. Phys. 79 (3), Feb. 1, 1996; 6 Pages.

* cited by examiner

ELECTROMAGNETIC INTERFERENCE SHIELDING POLYMER COMPOSITES AND METHODS OF MANUFACTURE

BACKGROUND

The invention relates generally to polymer composites. More specifically, to polymer composites capable of absorbing electromagnetic interference signals. The invention also relates to articles comprising polymer composites capable of absorbing electromagnetic interference signals.

Electrical and electronic devices are often sensitive to electromagnetic interference (EMI) that is present in the environment due to many sources. EMI sources may be self-induced due to noisy components (e.g. transistors), or externally induced by electronic equipment (e.g., fluorescent lighting, motors, radar transmitters). Electromagnetic energy may propagate by conduction through wires or conductive surfaces or through reactive coupling (inductive or capacitive-crosstalk between wires), or radiation. EMI often disrupts the device performance and may lead to total failure.

To reduce these problems, it is a common practice to shield the devices from external EMI. Conventionally, metal sheets such as Faraday cages are disposed around electrical systems to reflect the electromagnetic waves and to prevent the system from unwanted signals. However, they are bulky, not very effective at higher frequencies, and are difficult to form into highly convoluted shapes. Alternatively, electromagnetic absorbing layers are used, which could be used as a coating inside a Faraday box to dissipate any energy that enters rather than to allow it to build up inside of the resonant structure. Commonly used absorbing materials are based on either magnetic or conducting particles disposed within a polymer matrix. Dielectric or magnetic materials have intrinsic impedance different from that of free space (377 Ohms), which causes an electrical mismatch at the air/shield interface. The electrical mismatch may mitigate efficient EMI absorption. Conducting particles, on the other hand, contribute to the conductivity of the absorbing layer and may lead to electrical shortage or shock. Alternatively, certain absorber materials are being developed based on low dielectric constant (i.e., permittivity) materials. These materials are only effective in attenuating EMI at very large thicknesses. In spite of considerable effort, there is still a need for electromagnetic interference shielding that effectively operates at higher frequencies, is compact, thin, lightweight, and is suitable for wide frequency bands. Further, there is a need for simpler and versatile methods to prepare these materials for use in electromagnetic interference shielding.

SUMMARY OF THE INVENTION

The present invention meets these and other needs by providing an electromagnetic interference shielding composite that effectively operates over a wide range of frequencies. Accordingly, one embodiment of the invention is directed to an electromagnetic interference shielding composite. The electromagnetic interference shielding composite comprises: a high permittivity polymer having a permittivity of at least about 5; a plurality of magnetic particles dispersed within the high permittivity polymer; and a plurality of dielectric particles dispersed within the high permittivity polymer.

Another embodiment of the invention is directed to an article comprising a device susceptible to electromagnetic radiation and a shielding material disposed to shield the device from electromagnetic radiation. The shielding material comprises, a high permittivity polymer; a plurality of magnetic particles dispersed within the high permittivity polymer; and plurality of dielectric particles dispersed within the high permittivity polymer.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
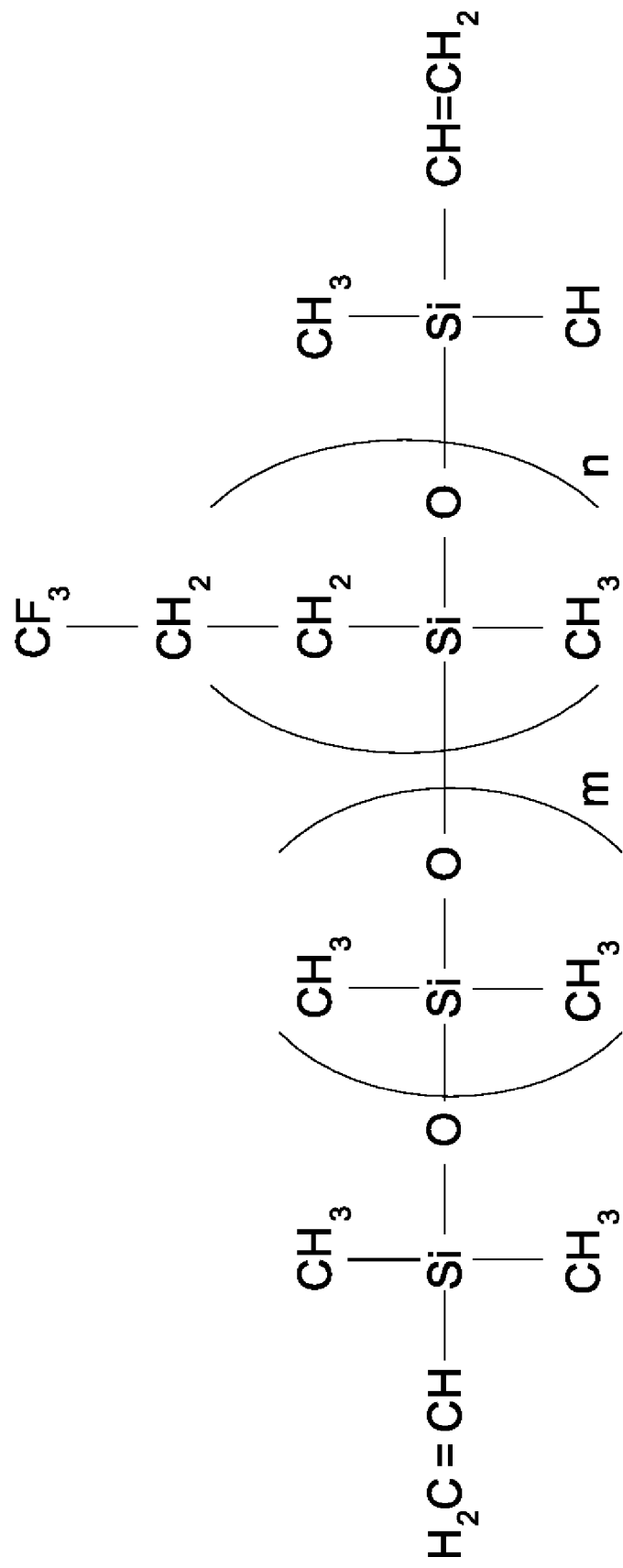
FIG. 1 shows schematic representations of chemical structures of high dielectric permittivity fluorosilicone polymers, for use in embodiments of the invention.

In the following description, like reference characters designate like or corresponding parts throughout the several views shown in the figures. It is also understood that terms such as "top," "bottom," "outward," "inward," "first," "second," and the like are words of convenience and are not to be construed as limiting terms. Furthermore, whenever a particular aspect of the invention is said to comprise or consist of at least one of a number of elements of a group and combinations thereof, it is understood that the aspect may comprise or consist of any of the elements of the group, either individually or in combination with any of the other elements of that group.

Referring to the drawings in general, it will be understood that the illustrations are for the purpose of describing one embodiment of the invention and are not intended to limit the invention thereto.

As used herein, the term "electromagnetic interference shielding" should be understood to include, and to be used interchangeably with, electromagnetic compatibility (EMC), surface grounding, corona shielding, radio frequency interference (RFI) shielding, and anti-static, i.e., electro-static discharge (ESD) protection. As used herein high permittivity polymer has a dielectric permittivity of at least about 5.

One embodiment of the invention is directed to an electromagnetic interference shielding composite. The composite comprises: a high permittivity polymer having a permittivity of at least about 5; a plurality of magnetic particles dispersed within the high permittivity polymer; and a plurality of dielectric particles dispersed within the high permittivity polymer.

Any polymer with a suitable value of permittivity may be selected depending upon one or more of operating temperature, hardness, chemical compatibility, flexibility, ability to recover after deformation, modulus, tensile strength, flammability, easy processability, or other chemical or physical property. The polymer desirably has a substantially high dielectric permittivity. Typically, the high permittivity polymer has dielectric permittivity in a range from about 5 to about 50. In a specific embodiment, the high permittivity polymer has dielectric permittivity in a range from about 10 to about 15. Examples of high permittivity polymers include, but are not limited to, fluorosilicone, poly(vinylidene fluoride), polyvinylidine fluoride-trifluoroethylene P(VDF-TrFE), polyvinylidene-tetrafluoroethylene copolymers P(VDF-TFE), polyvinylidine trifluoroethylene hexafluoropropylene copolymers P(VDF-TFE-HFE), polyvinylidine hexafluoropropylene copolymers P(VDF-HFE) and poly(vinylidine fluoride-trifluoroethylene-chlorofluoroethylene)terpolymer, cyanoethyl pullulan, cyanoethyl polyvinylalcohol, cyanoethyl hydroxyethyl cellulose, cyanoethyl sucrose, cyanoethyl-containing organopolysiloxane, a mixture of cyanoethyl pullulan and cyanoethyl cellulose, a cyanoethyl cellulose, epoxy, and any combination of two or more of these. The polymer matrix may be a blend, a copolymer, or an admixture. In an exemplary embodiment, the high permittivity polymer comprises fluorosilicone. Fluosilicone polymers may be either copolymer or homopolymer (with m=0). These copolymer and homopolymer silicones typically have dielectric permittivities of greater than 5 and dielectric loss factor of <0.01. Fluorosilicone advantageously offers high permittivity, low loss, easy processability, and wide operating temperature range. Another exemplary polymer is aromatic glycidyl amines epoxy resins. Other epoxies such as tetraglycidyl methylene dianiline and/or phenolic glycidyl ether epoxy resins may also be used.

Generally, the shielding composite comprises a plurality of dielectric and magnetic particles dispersed randomly in the polymer matrix. In general, the particles may be of any shape, or combination of shapes, and is referred broadly herein as being "particle," which should be understood to include without limitation solid or hollow spheres and microspheres, elastomeric balloons, flakes, platelets, fibers, rods, irregularly-shaped particles, fibers, which may be chopped or milled or whiskers, and powders.

A magnetic particle may include, for example, a ferromagnetic material, a ferrimagnetic material, or an antiferromagnetic material. Typically, the magnetic particles comprise a ceramic material. Some examples of suitable ceramic material include, but are not limited to, $BaFe_{12}O_{19}$, $(Bi,La,Tb)(Fe,Mn,Dy,Pr)O_3$, $Ba_3Co_2Fe_{24}O_{41}$, $Y_3Fe_5O_{12}$, $NiZnFe_2O_4$, $Cu_{0.2}Mg_{0.4}Zn_{0.4}Fe_2O_4$, $Fe_3O_4$ $(Cu,Ni,Zn)Fe_2O_4$, $TbMn_2O_5$, $PbNi_{1/33}Nb_{2/3}TiO_3$—$CuNiZn$, $BaTiO_3$—$NiZnFe_2O_4$, ferrite and combinations thereof. In one embodiment, the ceramic material comprises a ferrite such as $BaFe_{12}O_{19}$, $(Bi,La,Tb)(Fe,Mn,Dy,Pr)O_3$, $Ba_3Co_2Fe_{24}O_{41}$, $Y_3Fe_5O_{12}$, $NiZnFe_2O_4$, $Cu_{0.2}Mg_{0.4}Zn_{0.4}Fe_2O_4$, $Fe_3O_4$, $(Cu,Ni,Zn)Fe_2O_4$, $BaTiO_3$—$NiZnFe_2O_4$ ferrite. In an exemplary embodiment, the ceramic material comprises $BaFe_{12}O_{19}$. Ferrites have suitably high dielectric permittivity values and facilitates small loadings to achieve desirable high permittivity values for the composite.

A dielectric particle may include any electrically insulating material, including, for example, a high permittivity material, a ferroelectric material, or an antiferroelectric material. A number of ceramic materials have suitable dielectric permittivity values. Accordingly, in one embodiment, the dielectric particles comprise a ceramic material. The ceramic material may be a high permittivity oxide, a ferroelectric oxide, or an antiferroelectric oxide. An example of a suitable high permittivity oxide includes, but is not limited to, niobium oxide; tantalum oxide; zirconium oxide; titanium oxide; tin zirconium titanium oxide; barium neodymium titanium oxide $(Ba_{6-3x}Nd_{8+2x}Ti_{18}O_{54})$; magnesium titanium oxide; calcium titanium oxide; $ACu_3Ti_4O_{12}$, where A' is at least one selected from calcium (Ca) and cadmium (Cd); $A'_{2/3}Cu_3Ti_3FeO_{12}$, where A' at least one selected from bismuth (Bi) and yttrium (Y); $Li_xTi_yNi_{1-x-y}O$, where x is less than or equal to about 0.3 and y is less than or equal to about 0.1; and combinations thereof. In an exemplary embodiment, the electromagnetic interference shielding composite comprises $Ba_{6-3x}Nd_{8+2x}Ti_{18}O_{54}$. These materials have high permittivity values and are expected to significantly increase the total permittivity of the composites at small loadings.

An example of a suitable ferroelectric oxide includes, but is not limited to, $BaTiO_3$, $SrTiO_3$, $(Ba,Sr)TiO_3$, $Pb(Zr,Ti)O_3$, $SrBi_2Ta_2O_9$, $PbNi_{1/3}Nb_{2/3}TiO_3$—$PbTiO_3$, $PbMg_{1/3}Nb_{2/3}TiO_3$—$PbTiO_3$, lanthanum modified $Pb(Zr,Ti)O_3$, lanthanum and scandimium modified $Pb(Zr,Ti)O_3$, and combinations thereof. An example of a suitable antiferroelectric oxide includes, but is not limited to, $Pb(Zr_xTi_{1-x})O_3$, where $x \geq 1$; $PbHfO_3$; $PbZrO_3$; $Pb(ZrTi)O_3$; $PbLa(ZrSnTi)O_3$; $PbNb(ZrSnTi)O_3$; $Pb_{1-x}La_x(Zr_yTi_{1-y})_{(1-x)/4}O_3$, where $x \geq 1$ and $y \geq 1$; $NaNbO_3$; $(K,Na)(Nb,Ta)O_3$; $KNbO_3$; $BaZrO_3$; $Na_{0.25}K_{0.25}Bi_{0.5}TiO_3$; $Ag(Ta,Nb)O_3$; $Na_{0.5}Bi_{0.5}TiO_3$—$K_{0.5}Bi_{0.5}TiO_3$—$BaTiO_3$; and combinations thereof. Addition of these highly nonlinear permittivity fillers are expected to enable the field tuning effect in composite permittivity. Additionally, high permittivity may be achieved even at low filler loading levels.

The particle sizes of the magnetic and dielectric particles are generally chosen so as to maintain easy processibility. In one embodiment, the plurality of magnetic particles has a median particle size of less than about 10 micrometers. In another embodiment, the plurality of magnetic particles has a median particle size of less than about 500 nanometers. In one embodiment, the plurality of magnetic particles has a median particle size in a range from about 50 nanometers to about 200 nanometers. Generally, the plurality of dielectric particles has a median particle size of less than about 10 micrometers. In a specific embodiment, the plurality of dielectric particles has a median particle size of less than about 500 nanometers. Small sized particles may offer the advantages of better dispersion of particles within the polymer matrix, and may facilitate formation of smooth films with small thicknesses.

When the impedance of a shielding composite differs from the intrinsic impedance of free space, an electrical mismatch occurs at the air/shield interface. The electrical mismatch leads to significant reflection at the interface. The EMI reflection coefficient ($\Gamma$) is expressed in the following equation. When the impedance of the composite ($\eta_m$) and the free space ($\eta_0$) equals, all EMI is absorbed or transmitted (no mismatch).

$$\Gamma = \frac{E^r}{E^i} = \frac{\eta_m - \eta_0}{\eta_m + \eta_0} \qquad (1)$$

This requires epsilon($\in$)=mu($\mu$) at any frequency $\omega$ as shown in the following expression.

$$\eta_m = \sqrt{\frac{\mu_m}{\varepsilon_m\left(1 - j\frac{\sigma_m}{\omega\varepsilon_m}\right)}} \qquad (2)$$

where $\sigma_m$ represents the electrical conductivity of the composite and $\in_m$ represents dielectric permittivity of the composite.

For example, if $\in_m$ and $\mu_m$ differ by 2×, impedance changes by 1.4×. Impedance mismatch with air will be 17%. Therefore, 17% of EMI is reflected back, which loses absorbing efficiency. This may be in an acceptable range depending on the frequency range.

Typically, the loading of dielectric and magnetic particles is adjusted to provide specific dielectric permittivity, magnetic permeability, and impedance values to the composite, given the dielectric permittivity and magnetic permeability of particles and the polymer matrix chosen. Also, an excessively high particle loading may affect the processibility of the composite. In one embodiment, a volume fraction of the magnetic particles is less than about 10 volume percent of the electromagnetic interference shielding composite. In another embodiment, a volume fraction of the magnetic particles is in a range from about 5 volume percent to about 10 volume percent of the electromagnetic interference shielding composite. In one embodiment, a volume fraction of the dielectric particles is less than about 40 volume percent of the electromagnetic interference shielding composite. In another embodiment, a volume fraction of the dielectric particles is in a range from about 10 volume percent to about 20 volume percent of the electromagnetic shielding composite. The loading of dielectric and magnetic particles is chosen such that a total volume fraction of the magnetic and dielectric particles is less than about 60 volume percent of the electromagnetic shielding composite. In a specific embodiment, a total volume fraction of the magnetic and dielectric particles is in a range from about 10 volume percent to about 20 volume percent of the electromagnetic shielding composite.

The electromagnetic interference shielding composite materials of the embodiments with specific amounts of dielectric and magnetic particles have an impedance in a range from about 300 ohms to about 450 ohms, which is close to the intrinsic impedance of free space (377 Ohms), thereby facilitating efficient EMI absorption. They are effective in protecting many electrical and electronic devices from electromagnetic interference radiation over a frequency range of from about 10 MHz to about 1 GHz. The composition and amount of particles may be optimized such that the shielding material is highly absorptive in one or more selected frequency ranges.

The shielding composite may include various property modifiers to improve processing or durability. Small quantities of other filler materials/additives may be present to improve certain specific properties. Such fillers and additives, which may be functional or inert, may include one or more of the following: wetting agents or surfactants, pigments, dispersants, dyes, and other colorants, foaming or anti-foaming agents, anti-static agents, coupling agents such as titanates, chain extending oils, flow modifiers, pigments, lubricants, film-reinforcing polymers and other agents, stabilizers, emulsifiers, antioxidants, thickeners, and flame retardants. Typically, these fillers and additives are blended or otherwise admixed with the formulation or with the polymer component thereof, and may be present in small quantities so that the magnetic and dielectric properties of the composite remains significantly unaffected.

The shielding composite may be formed by any known composite forming techniques. It may be formed by mixing a precursor of the matrix polymer material with the particles, and then processing the precursor to form a desired composite material. For example, the particles may be mixed with a monomer, which is then polymerized to form a polymer matrix composite. In another embodiment, the particles may be mixed with a matrix powder composition and compacted to form a solid composite. In yet another embodiment, the matrix composition may be dissolved in a solvent and mixed with the particles, and then the solvent may be removed to form a solid composite. In still another embodiment, the composite may be a liquid or have liquid-like properties. In the above embodiments, the particles may be mixed with the matrix material by any convenient milling or blending techniques. In all the above embodiments, the shielding composite may be made in the form of a sheet, film, a coating, a coating solution, or a coating gel with relative ease. A film or coating may be formed by any known coating techniques including spraying, spin coating, dipping, roller coating, and the like. Alternatively, they may be economically molded or otherwise formed into a variety of complex shapes by any known methods of molding including compression and injection techniques.

The electromagnetic interference shielding composite may be made into very thin sheets or coatings. Thus the shielding composite may be used to cover any device even if it has a complicated shape. The effectiveness of the shielding afforded by the composite material is not affected by the molding, forming, or otherwise shaping processes. The composite may be disposed within an electrical device or an electronic device or may be used to cover the device externally. Ability to dispose the coating material within the device would facilitate effective isolation of a source of radiation or protection of a selected component within a system.

The shielding composite of the embodiments is suitable to confine the EMI energy within a source device and to insulate that device or other "target" devices from other source devices. Such shielding may be provided as a barrier, which is interposed between the source and the other devices or as a "can" which covers a discrete component of the device. Examples of the electrical or electronic device include, but are not limited to, a cellular telephone, telephone handset, or other electronics device such as a personal communications services (PCS) handset, PCMCIA card, global positioning system (GPS), radio receiver, personal digital assistant (PDA), notebook or desktop personal computer (PC), cordless telephone handset, network router or server, medical electronics device, modem, wireless communication base station, telemetry device, telematic component or system, and the like. These coatings may be suitable for protecting a computer, a telecommunication device, a power supply, a room containing electrical and/or electronic equipment, an aircraft component, an automotive part, a medical device, a radar system, a ship power electronics system, a control system for an electrical grid, a control system for a telecommunication system, and other electronic equipment.

In an exemplary embodiment, an electromagnetic interference shielding composite is provided, which is suitable for shielding over a wide range of frequencies. The electromagnetic interference shielding composite comprises: a fluorosilicone polymer; a plurality of magnetic particles dispersed within the fluorosilicone polymer in a range from about 5 volume percent to about 10 volume percent; and a plurality of dielectric particles dispersed within the fluorosilicone polymer in a range from about 10 volume percent to about 20 volume percent. The advantages of these electromagnetic interference shielding composites are relatively high permittivity (~9) and operation temperature, and very low dielectric loss, as well as attractive flexibility and processibility characteristics.

In an exemplary embodiment, an article is provided that comprises a device susceptible to electromagnetic radiation, and a shielding material disposed to shield the device from electromagnetic radiation. The shielding material comprises a high permittivity polymer; a plurality of magnetic particles dispersed within the high permittivity polymer; and plurality of dielectric particles dispersed within the high permittivity polymer. The composition and the relative amounts of the high permittivity polymer, the dielectric particles, and magnetic particles may be optimized as discussed above in detail in the shielding composite embodiments. In an exemplary embodiment, the device comprises a cellular telephone component. The capabilities of the composites described herein to work effectively at high frequencies provide distinct advantages for shielding cellular telephone components.

The EMI shielding composites described herein are fundamentally different from the polymer composites conventionally used. Polymer-filler composites are extensively used for various applications, but little has been reported regarding the use of high permittivity polymers for EMI shielding applications. The inventors surprisingly discovered the synergetic benefits of combining high permittivity polymers along with dielectric and magnetic particles to generate suitable dielectric, magnetic and impedance values to achieve EMI shielding capabilities. The EMI shielding composites described herein are characterized by an impedance value close to that of free space facilitating efficient EMI absorption. They are free of any conducting particles, which may lead to electrical shortage or shock. They are effective in attenuating EMI at very small thicknesses and are capable of operating at higher frequencies and over a large frequency band.

The following example describes a preparation method for making a EMI shielding composite based on fluorosilicone polymer in accordance with embodiments of the present invention. The example is intended merely to more fully explain embodiments of the present invention and is not intended to be limiting.

EXAMPLE 1

Figure 2:
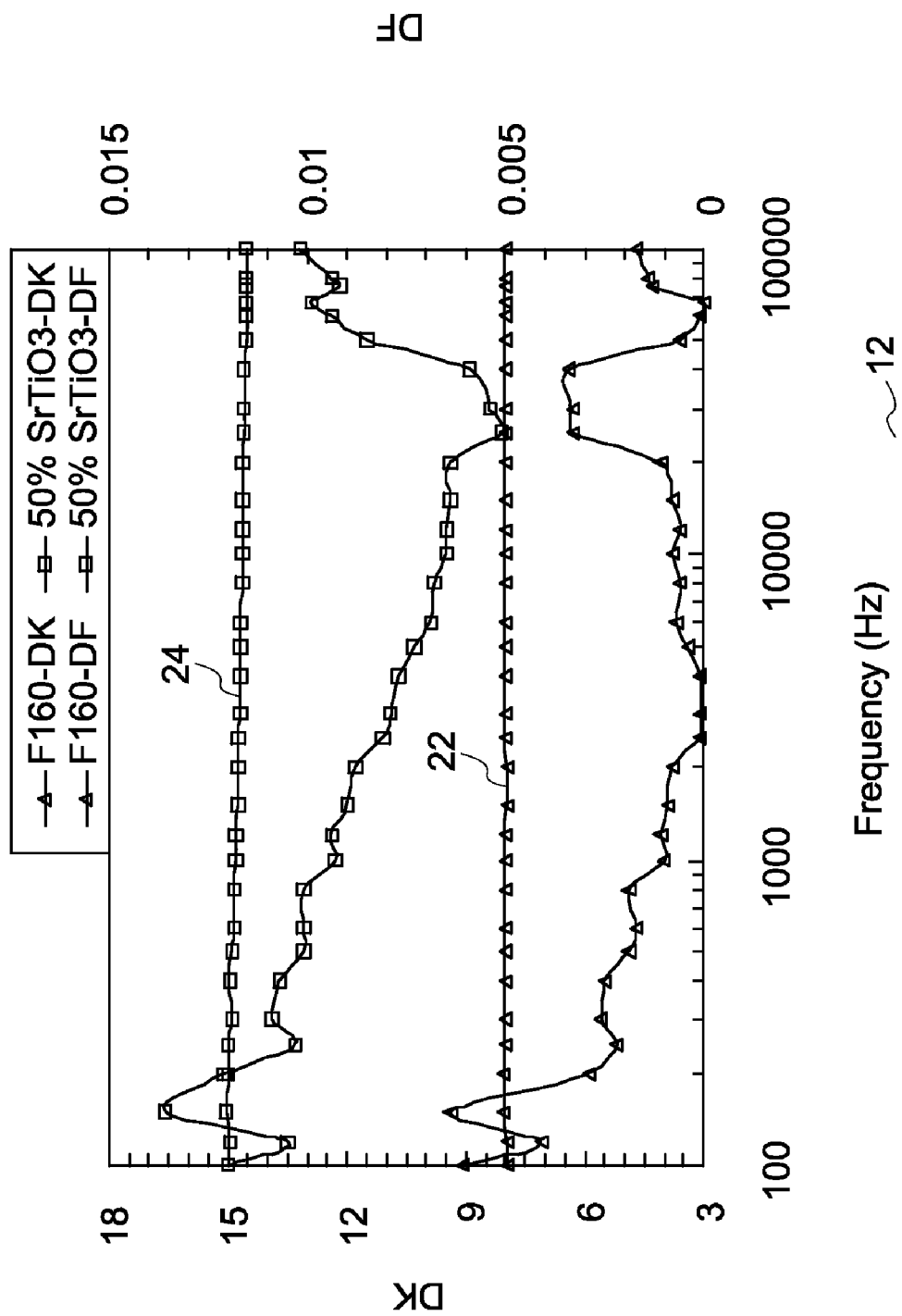
FIG. 2 illustrates a plot of dielectric permittivity vs. frequency for a electromagnetic interference composite based on fluorosilicone polymer, according to one embodiment of the invention.

20 grams of fluorosilicone (chemical structure shown in FIG. 1) was prepared as a base resin. Homopolymer silicone resin (with m=0 in the chemical structure shown in FIG. 1) is a gel at room temperature and was diluted in MEK (methyl ether ketone) to form 20 wt % solution. 20 g of $SrTiO_3$ nanoparticles (with mean particle size of 40 nanometers) were dispersed into the solution with high shear mixing. (Note: If sonication is preferred for better particle dispersion, the resin needs to be diluted further with MEK to adjust the viscosity to ~30 cps.) The silicone resin was cured by adding 5 wt % peroxide (dicumyl peroxide) with good mixing. The solvent was evaporated under vacuum and silicone resin was cured at 180° C. for 2 hours. As an exemplary alternative, the silicone resin may be cured by adding 1.2 wt % silicone hydride and 4 ppm Pt catalyst, followed by solvent evaporation at room temperature under vacuum and 180° C. curing for 30 min. The dielectric permittivity (Dk) and dielectric loss factor (Df) for a sample fluorosilicone copolymer composite with 50 wt % $SrTiO_3$ is shown in FIG. 2. The dielectric permittivity of the silicone composite could be controllably varied without significantly affecting dielectric loss factor by controlling the amount of $SrTiO_3$ addition. As shown in FIG. 2, the dielectric permittivity of the fluorosilicone copolymer (22) was increased from 8 to 15 by adding 50 wt % $SrTiO_3$ in volume (24).

EXAMPLE 2

Figure 3:
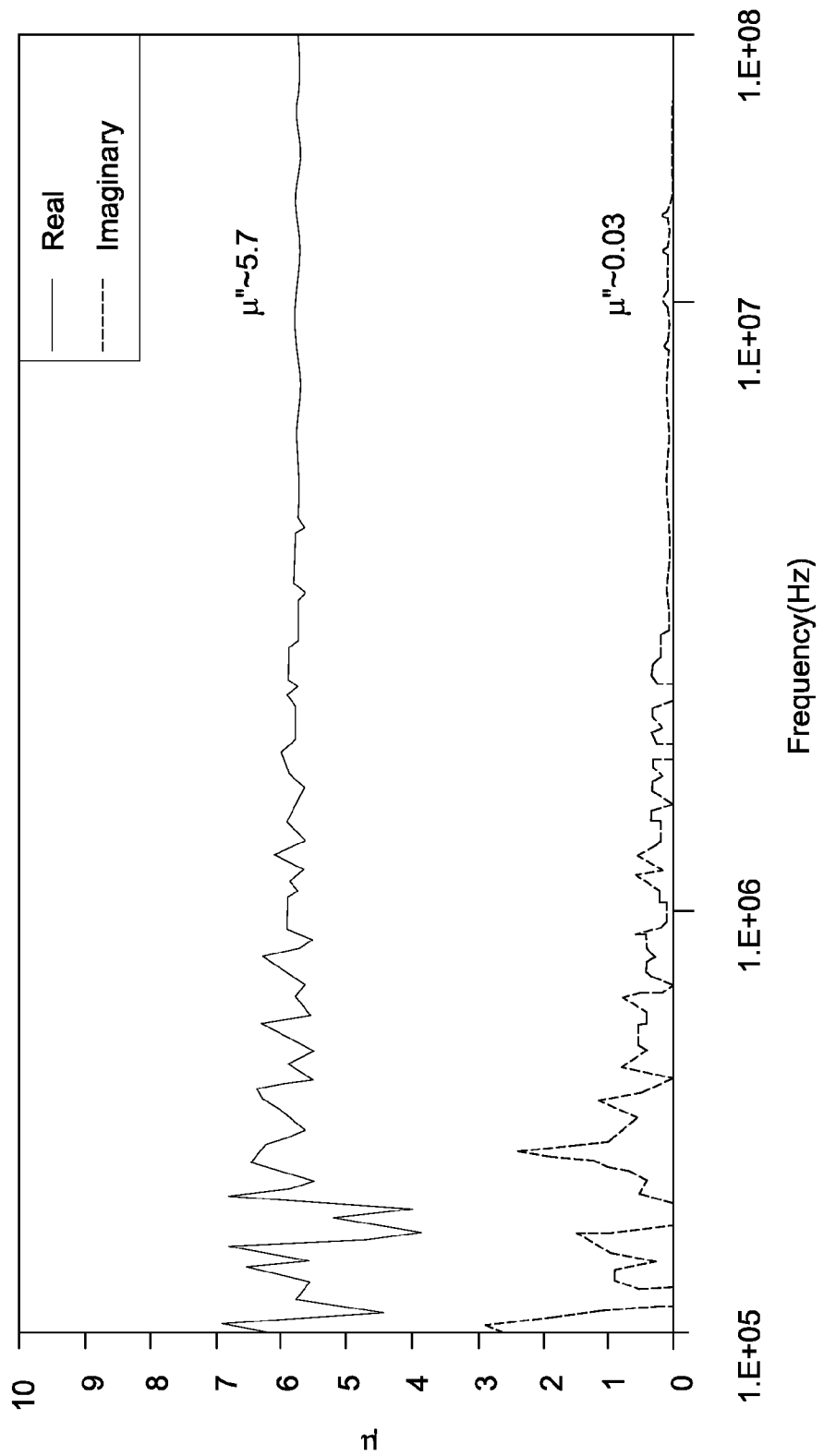
FIG. 3 illustrates a plot of magnetic permeability vs. frequency for a electromagnetic interference composite based on aromatic glycidyl amine epoxy resins, according to one embodiment of the invention.
Figure 4:
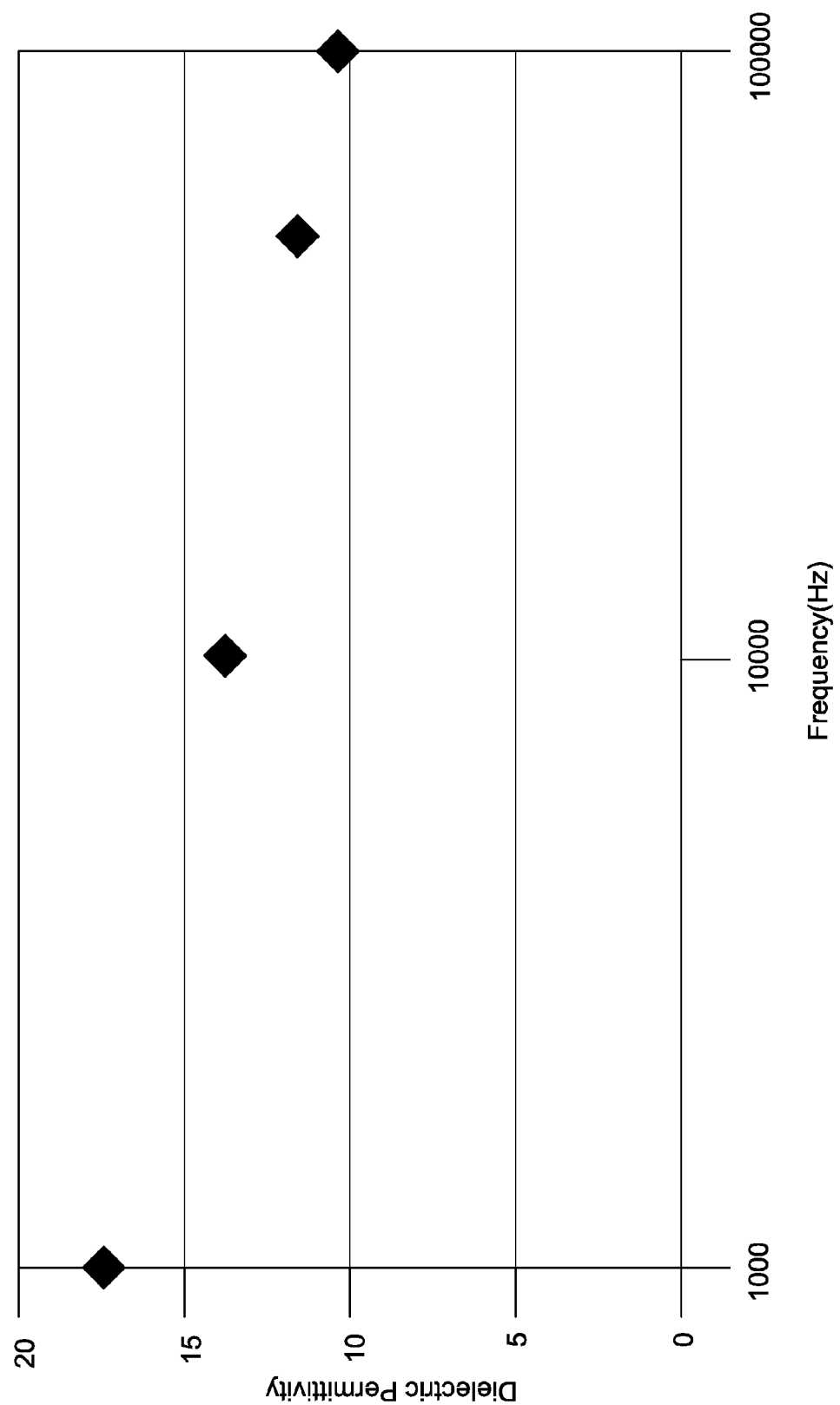
FIG. 4 illustrates a plot of dielectric permittivity vs. frequency for a electromagnetic interference composite based on aromatic glycidyl amine epoxy resins, according to one embodiment of the invention.
Figure 5:
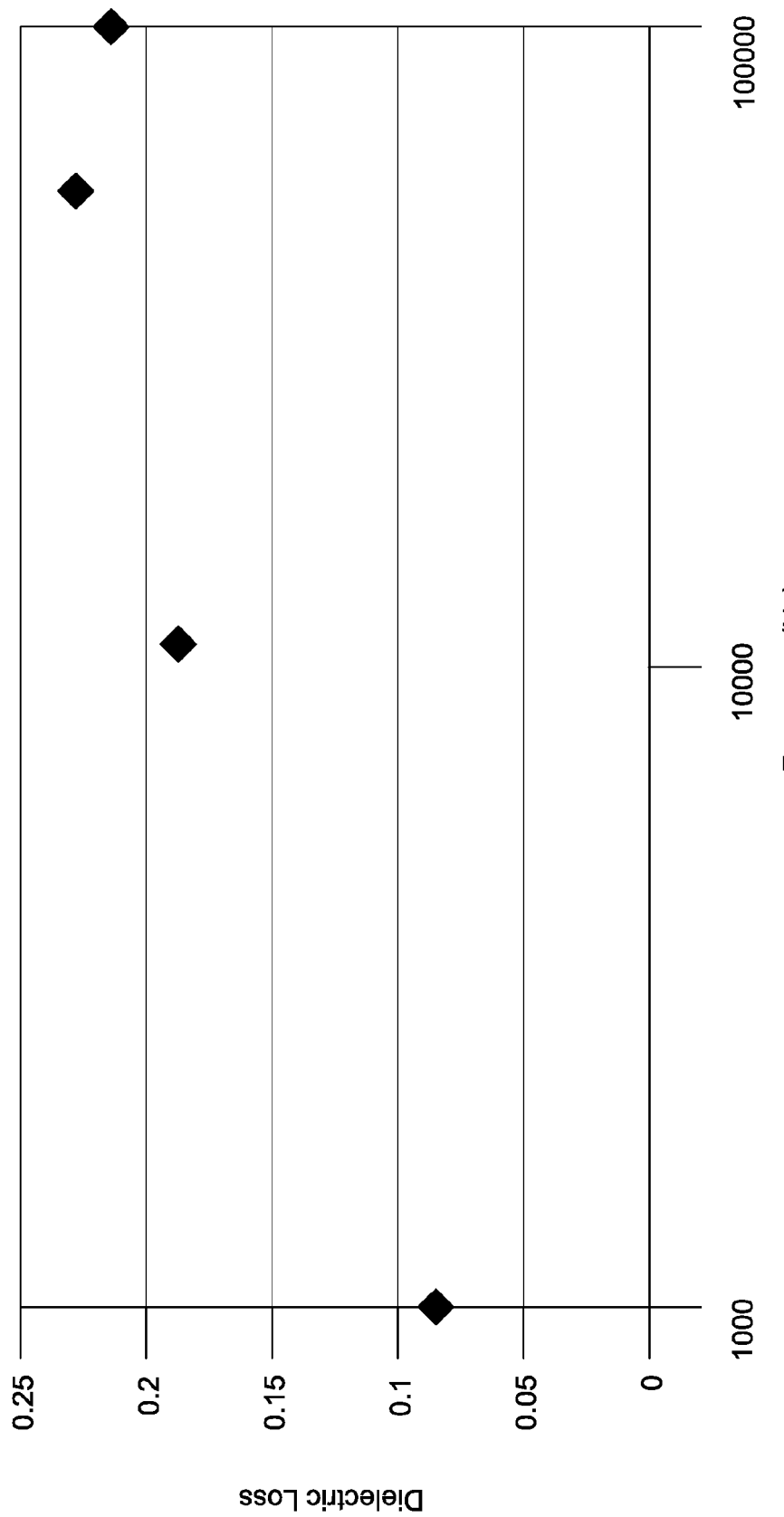
FIG. 5 illustrates a plot of dielectric loss vs. frequency for a electromagnetic interference composite based on aromatic glycidyl amine epoxy resins, according to one embodiment of the invention.

100 grams of tetraglycidyl methylene dianiline epoxy resin was pre-heated to 80° C. to reduce the viscosity to <100 cps. 100 grams of $BaFe_{12}O_{19}$ powder with particle size of less than 100 nanometers was dispersed into the epoxy resin with high shear mixer. After vacuum degassing, the sample was thermally cured at 180° C. for two hours. The magnetic permeability of the composite is plotted in FIG. 3 as a function of frequency and dielectric permittivity and dielectric loss factor are plotted in FIGS. 4 and 5, respectively. The plots show the magnetic permeability and dielectric permittivity of the composite are in the optimal range for EMI absorbing applications.

While only certain features of the invention have been illustrated and described herein, many modifications and changes will occur to those skilled in the art. It is, therefore, to be understood that the appended claims are intended to cover all such modifications and changes as fall within the true spirit of the invention. It should be understood that though the above embodiments are discussed as an EMI shielding composite, the embodiments of the invention may be utilized in any other application, in which the dielectric or magnetic properties of the composites are essentially beneficial.

The invention claimed is:

1. An electromagnetic interference shielding composite comprising:
    a high permittivity polymer having a permittivity of at least about 5, and wherein the high permittivity polymer comprises fluorosilicone;
    a plurality of magnetic particles dispersed within the high permittivity polymer wherein the plurality of magnetic particles has a median particle size of less than about 500 nanometers; and
    a plurality of dielectric particles dispersed within the high permittivity polymer.

2. The electromagnetic interference shielding composite of claim 1, wherein the magnetic particles comprise a ceramic material.

3. The electromagnetic interference shielding composite of claim 2, wherein the ceramic material comprises at least one selected from the group consisting of $BaFe_{12}O_{19}$, $(Bi,La,Tb)(Fe,Mn,Dy,Pr)O_3$, $Ba_3Co_2Fe_{24}O_{41}$, $Y_3Fe_5O_{12}$, $NiZnFe_2O_4$, $Cu_{0.2}Mg_{0.4}Zn_{0.4}Fe_2O_4$, $Fe_3O_4$, $(Cu,Ni,Zn)Fe_2O_4$, $TbMn_2O_5$, $PbNi_{1/3}Nb_{2/3}TiO_3$—CuNiZn, $BaTiO_3$—$NiZnFe_2O_4$ ferrite, and combinations thereof.

4. The electromagnetic interference shielding composite of claim 2, wherein the ceramic material comprises at least one selected from the group consisting of $BaFe_{12}O_{19}$, $Ba_3Co_2Fe_{24}O_{41}$, $Y_3Fe_5O_{12}$, $NiZnFe_2O_4$, $Cu_{0.2}Mg_{0.4}Zn_{0.4}Fe_2O_4$, $Fe_3O_4$, $(Cu,Ni,Zn)Fe_2O_4$, $BaTiO_3$—$NiZnFe_2O_4$ ferrite, and combinations thereof.

5. The electromagnetic interference shielding composite of claim 2, wherein the ceramic material comprises $BaFe_{12}O_{19}$.

6. The electromagnetic interference shielding composite of claim 1, wherein the plurality of magnetic particles has a median particle size in a range from about 50 nanometers to about 200 nanometers.

7. The electromagnetic interference shielding composite of claim 1, wherein the dielectric particles comprise a ceramic material.

8. The electromagnetic interference shielding composite of claim 7, wherein the ceramic material comprises at least one material selected form the group consisting of a high permittivity oxide, a ferroelectric oxide, and an antiferroelectric oxide.

9. The electromagnetic interference shielding composite of claim 8, wherein the high permittivity oxide is at least one selected from the group consisting of niobium oxide; tantalum oxide; zirconium oxide; titanium oxide; tin zirconium titanium oxide; barium neodymium titanium oxide ($Ba_{6-3x}Nd_{8+2x}Ti_{18}O_{54}$); magnesium titanium oxide; calcium titanium oxide; $ACu_3Ti_4O_{12}$, where A is at least one selected from calcium (Ca) and cadmium (Cd); $A'_{2/3}Cu_3Ti_3FeO_{12}$, where A' at least one selected from bismuth (Bi) and yttrium (Y); $Li_xTi_yNi_{1-x-y}O$, where x is less than or equal to about 0.3 and y is less than or equal to about 0.1; and combinations thereof.

10. The electromagnetic interference shielding composite of claim 8, wherein the high permittivity oxide comprises $Ba_{6-3x}Nd_{8+2x}Ti_{18}O_{54}$.

11. The electromagnetic interference shielding composite of claim 8, wherein the ferroelectric oxide is at least one selected from the group consisting of $BaTiO_3$; $SrTiO_3$; (Ba,Sr)$TiO_3$; Pb(Zr,Ti)$O_3$; $SrBi_2Ta_2O_9$; $PbNi_{1/3}Nb_{2/3}TiO_3$—$PbTiO_3$; $PbMg_{1/3}Nb_{2/3}TiO_3$—$PbTiO_3$; lanthanum modified Pb(Zr,Ti)$O_3$; lanthanum and scandimium modified Pb(Zr,Ti)$O_3$; and combinations thereof.

12. The electromagnetic interference shielding composite of claim 8, wherein the antiferroelectric oxide is at least one selected from the group consisting of Pb($Zr_xTi_{1-x}$)$O_3$, where $x \leq 1$; $PbHfO_3$; $PbZrO_3$; Pb(ZrTi)$O_3$; PbLa(ZrSnTi)$O_3$; PbNb(ZrSnTi)$O_3$; $Pb_{1-x}La_x(Zr_yTi_{1-y})_{(1-x)/4}O_3$, where $x \leq 1$ and $y \leq 1$; $NaNbO_3$; (K,Na)(Nb,Ta)$O_3$; $KNbO_3$; $BaZrO_3$; $Na_{0.25}K_{0.25}Bi_{0.5}TiO_3$; Ag(Ta,Nb)$O_3$; $Na_{0.5}Bi_{0.5}TiO_3$—$K_{0.5}Bi_{0.5}TiO_3$—$BaTiO_3$; and combinations thereof.

13. The electromagnetic interference shielding composite of claim 1, wherein the plurality of dielectric particles has a median particle size of less than about 10 micrometers.

14. The electromagnetic interference shielding composite of claim 13, wherein the plurality of dielectric particles has a median particle size of less than about 500 nanometers.

15. The electromagnetic interference shielding composite of claim 1, wherein a total volume fraction of the magnetic and dielectric particles is less than about 60 volume percent of the electromagnetic shielding composite.

16. The electromagnetic interference shielding composite of claim 15, wherein a total volume fraction of the magnetic and dielectric particles is in a range from about 10 volume percent to about 20 volume percent of the electromagnetic shielding composite.

17. The electromagnetic interference shielding composite of claim 1, wherein a volume fraction of the magnetic particles is less than about 10 volume percent of the electromagnetic interference shielding composite.

18. The electromagnetic interference shielding composite of claim 17, wherein a volume fraction of the magnetic particles is in a range from about 5 volume percent to about 10 volume percent of the electromagnetic interference shielding composite.

19. The electromagnetic interference shielding composite of claim 1, wherein a volume fraction of the dielectric particles is less than about 40 volume percent of the electromagnetic interference shielding composite.

20. The electromagnetic interference shielding composite of claim 19, wherein a volume fraction of the dielectric particles is in a range from about 10 volume percent to about 20 volume percent of the electromagnetic shielding composite.

21. The electromagnetic interference shielding composite of claim 1, wherein the high permittivity polymer has a permittivity in a range from about 5 to about 50.

22. The electromagnetic interference shielding composite of claim 21, wherein the high permittivity polymer has a permittivity in a range from about 10 to about 15.

23. The electromagnetic interference shielding composite of claim 1, having an impedance in a range from about 300 ohms to about 450 ohms.

24. The electromagnetic interference shielding composite of claim 1, absorptive of electromagnetic radition over a frequency range of from about 10 MHz to about 1 GHz.

25. The electromagnetic interference shielding composite of claim 1, in the form of a sheet, film, a coating, a coating solution, or a coating gel.

26. The electromagnetic interference shielding composite of claim 1, wherein the composite is disposed within or on an electrical or an electronic device.

27. The electromagnetic interference shielding composite of claim 26, wherein the electrical or electronic device is selected from the group consisting of a cellular telephone, a computer, a telecommunication device, a power supply, a room containing electrical and/or electronic equipment, an aircraft component, an automotive part, a medical device, a radar system, a ship power electronics system, a control system for an electrical grid, and a control system for a telecommunication system.

28. An electromagnetic interference shielding composite comprising:
 a fluorosilicone polymer; and
 a plurality of magnetic particles dispersed within the fluorosilicone polymer at a loading in a range from about 5 volume percent to about 10 volume percent; and
 a plurality of dielectric particles dispersed within the fluorosilicone polymer at a loading in a range from about 10 volume percent to about 20 volume percent.

29. An article comprising:
 a device susceptible to electromagnetic radiation; and
 a shielding material disposed to shield the device from electromagnetic radiation, wherein the shielding material comprises
  a high permittivity polymer, and wherein the high permittivity polymer comprises fluorosilicone,
  a plurality of magnetic particles dispersed within the high permittivity polymer wherein the plurality of magnetic particles has a median particle size of less than about 500 nanometers, and
  a plurality of dielectric particles dispersed within the high permittivity polymer.

30. The article of claim 29, wherein the magnetic particle comprises at least one selected from the group consisting of $BaFe_{12}O_{19}$, (Bi,La,Tb)(Fe,Mn,Dy,Pr)$O_3$, $Ba_3Co_2Fe_{24}O_{41}$, $Y_3Fe_5O_{12}$, $NiZnFe_2O_4$, $Cu_{0.2}Mg_{0.4}Zn_{0.4}Fe_2O_4$, $Fe_3O_4$, (Cu,Ni,Zn)$Fe_2O_4$, $TbMn_2O_5$, $PbNi_{1/3}Nb_{2/3}TiO_3$—CuNiZn, $BaTiO_3$—$NiZnFe_2O_4$ ferrite, and combinations thereof.

31. The article of claim 29, wherein the dielectric particle comprises at least one selected from the group consisting of $ACu_3Ti_4O_{12}$, where A is at least one selected from calcium (Ca) and cadmium (Cd); $A'_{2/3}Cu_3Ti_3FeO_{12}$, where A' at least one selected from bismuth (Bi) and yttrium (Y); $Li_xTi_yNi_{1-x-y}O$, where x is less than or equal to about 0.3 and y is less than or equal to about 0.1; $BaTiO_3$; $SrTiO_3$; (Ba,Sr)$TiO_3$; Pb(Zr,Ti)$O_3$; $SrBi_2Ta_2O_9$; $PbNi_{1/3}Nb_{2/3}TiO_3$—$PbTiO_3$; $PbMg_{1/3}Nb_{2/3}TiO_3$—$PbTiO_3$; lanthanum modified Pb(Zr,Ti)$O_3$; lanthanum and scandimium modified Pb(Zr,Ti)$O_3$; Pb($Zr_xTi_{1-x}$)$O_3$, where $x \leq 1$; $PbHfO_3$; $PbZrO_3$; Pb(ZrTi)$O_3$; PbLa(ZrSnTi)$O_3$; PbNb(ZrSnTi)$O_3$; $Pb_{1-x}La_x(Zr_yTi_{1-y})_{1-x/4}O_3$, where $x \leq 1$ and $y \leq 1$; $NaNbO_3$; (K,Na)(Nb,Ta)$O_3$; $KNbO_3$; $BaZrO_3$; $Na_{0.25}K_{0.25}Bi_{0.5}TiO_3$; Ag(Ta,Nb)$O_3$; $Na_{0.5}Bi_{0.5}TiO_3$—$K_{0.5}Bi_{0.5}TiO_3$—$BaTiO_3$; and combinations thereof.

32. The article of claim 29, wherein the device comprises a cellular telephone component.

* * * * *

UNITED STATES PATENT AND TRADEMARK OFFICE
CERTIFICATE OF CORRECTION

PATENT NO. : 7,815,820 B2  
APPLICATION NO. : 11/863831  
DATED : October 19, 2010  
INVENTOR(S) : Tan et al.

Page 1 of 1

It is certified that error appears in the above-identified patent and that said Letters Patent is hereby corrected as shown below:

In Column 3, Line 22, delete "Fluosilicone" and insert -- Fluorosilicone --, therefor.

In Column 3, Line 47, delete "Fe$_3$O$_4$" and insert -- Fe$_3$O$_4$, --, therefor.

In Column 3, Line 48, delete "NiZnFe$_2$O$_4$," and insert -- NiZnFe$_2$O$_4$ --, therefor.

In Column 4, Line 2, delete "A'" and insert -- A --, therefor.

In Column 4, Line 20, delete "Pb(ZrTi)O$_3$;" and insert -- Pb(Zr,Ti)O$_3$; --, therefor.

In Column 9, Line 21, in Claim 12, delete "Pb(ZrTi)O$_3$;" and insert -- Pb(Zr,Ti)O$_3$; --, therefor.

In Column 10, Line 2, in Claim 24, delete "radition" and insert -- radiation --, therefor.

In Column 10, Line 32, in Claim 29, delete "comprises" and insert -- comprises: --, therefor.

In Column 10, Line 57, in Claim 31, delete "Pb(ZrTi)O$_3$;" and insert -- Pb(Zr,Ti)O$_3$; --, therefor.

Signed and Sealed this  
Tenth Day of May, 2011

David J. Kappos  
*Director of the United States Patent and Trademark Office*